United States Patent
Xu

(10) Patent No.: US 7,968,441 B2
(45) Date of Patent: Jun. 28, 2011

(54) DOPANT ACTIVATION ANNEAL TO ACHIEVE LESS DOPANT DIFFUSION (BETTER USJ PROFILE) AND HIGHER ACTIVATION PERCENTAGE

(75) Inventor: Zhi Xu, Pudong (CN)

(73) Assignee: Applied Materials, Inc., Santa Clara, CA (US)

( * ) Notice: Subject to any disclaimer, the term of this patent is extended or adjusted under 35 U.S.C. 154(b) by 198 days.

(21) Appl. No.: 12/247,448

(22) Filed: Oct. 8, 2008

(65) Prior Publication Data
US 2010/0087052 A1    Apr. 8, 2010

(51) Int. Cl.
*H01L 21/425* (2006.01)
(52) U.S. Cl. ........... 438/530; 438/710; 438/715
(58) Field of Classification Search ......... 438/474, 438/530, 710, 711, 715, 723, 906
See application file for complete search history.

(56) References Cited

U.S. PATENT DOCUMENTS

| | | | |
|---|---|---|---|
| 2005/0221552 A1 | 10/2005 | Kao et al. | |
| 2005/0257890 A1* | 11/2005 | Park et al. | 156/345.35 |
| 2008/0160210 A1* | 7/2008 | Yang et al. | 427/534 |
| 2008/0230846 A1* | 9/2008 | Obeng et al. | 257/384 |
| 2009/0162996 A1* | 6/2009 | Ramaswamy et al. | 438/477 |

* cited by examiner

*Primary Examiner* — Kevin M Picardat
(74) *Attorney, Agent, or Firm* — Patterson & Sheridan, L.L.P.

(57) ABSTRACT

A method and apparatus for forming a semiconductor device. A semiconductor substrate is implanted with dopants. The substrate is subjected to a cleaning process employing electrically neutral nitrogen and fluorine radicals to produce an oxygen-free surface having dangling bonds. Before any further exposure to oxidizing gases, the substrate is annealed by thermal treatment to activate and distribute the dopants. A gate oxide layer is formed over the annealed surface. The apparatus performs all such treatments without breaking vacuum.

13 Claims, 6 Drawing Sheets

DOPANT ACTIVATION ANNEAL TO ACHIEVE LESS DOPANT DIFFUSION (BETTER USJ PROFILE) AND HIGHER ACTIVATION PERCENTAGE

FIELD OF THE INVENTION

Embodiments of the invention relate to semiconductor device manufacturing methods and apparatus. More particularly, embodiments of the invention relate to methods of making a doped semiconductor device.

BACKGROUND

For 50 years, the semiconductor manufacturing industry has followed the arc of Moore's Law, which states that the number of transistors on an integrated circuit chip doubles about every two years. The progression of Moore's Law imposes requirements on manufacturers to develop processes and equipment suited to constructing devices with ever-decreasing dimensions. Such demanding requirements imply tolerance of imperfection and impurity that rapidly approaches zero.

Semiconductor devices are generally constructed by implanting dopants into a semiconductor substrate, such as a silicon substrate. A layer of oxide is applied over the doped substrate to serve as a gate. As such devices grow smaller, implantation depth declines, and the effect of any impurity or imperfection in construction of the device is magnified. The processes used for implanting dopants, annealing or thermally treating substrates, cleaning substrates, and applying gate oxide layers must continually improve to drive such impurities and imperfections to lower levels. Thus, there is a continuing need for improved processes for constructing such semiconductor devices.

SUMMARY

Embodiments of the invention provide a method of processing a doped semiconductor substrate, comprising disposing the substrate in a processing chamber, providing a cleaning gas comprising a mixture of ammonia, nitrogen trifluoride, and a carrier gas to the processing chamber, converting a portion of the cleaning gas to neutral radicals by applying RF power, forming a sublimation layer on the doped semiconductor substrate by exposing the substrate to the cleaning gas, forming an oxygen-free surface on the doped semiconductor substrate by heating the sublimation layer, activating the dopants in the doped semiconductor substrate by an annealing process, and maintaining a partial pressure of oxidizing gases below about 1 mTorr for the duration of the method.

Other embodiments of the invention provide a process for forming a device on a substrate, comprising implanting dopants into a surface of the substrate, terminating the implanted surface with dangling bonds by exposing the substrate to a reducing gas at a temperature less than about 100° C., activating the dopants by heating the implanted surface of the substrate, and forming an oxide layer over the implanted surface.

Other embodiments of the invention provide an apparatus for processing a substrate, comprising a transfer chamber configured to operate under vacuum, an implant chamber coupled to the transfer chamber, a neutral radical cleaning chamber coupled to the transfer chamber, and a thermal treatment chamber coupled to the transfer chamber.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide apparatus, processes, and methods for processing semiconductor substrates. In processes wherein a surface of a semiconductor substrate is implanted with p-type or n-type dopants, the implanted regions of the substrate must be annealed to activate and distribute the dopants and recrystallize the substrate. Prior to the anneal, the substrate is generally cleaned to remove any oxide layers on the substrate surface. Embodiments of the invention provide a cleaning process comprising radical species that etch oxides from the surface of a semiconductor substrate, leaving a clean surface that may be terminated with a substantial fraction of dangling bonds. Such a cleaning process enables more effective annealing at lower temperature, as well as more effective gate oxide formation over the annealed surface.

Dopants are implanted into a surface of a semiconductor device to make a doped semiconductor surface. Dopants may generally be implanted using a plasma process or by an ion implant process. In a plasma implant process, dopant atoms or molecules are ionized by exposure to an electric field. The ionized dopant atoms are directed toward a substrate by another electric field oriented to propel the ions toward the substrate. The ions impact the substrate and implant below the surface.

Figure 1:
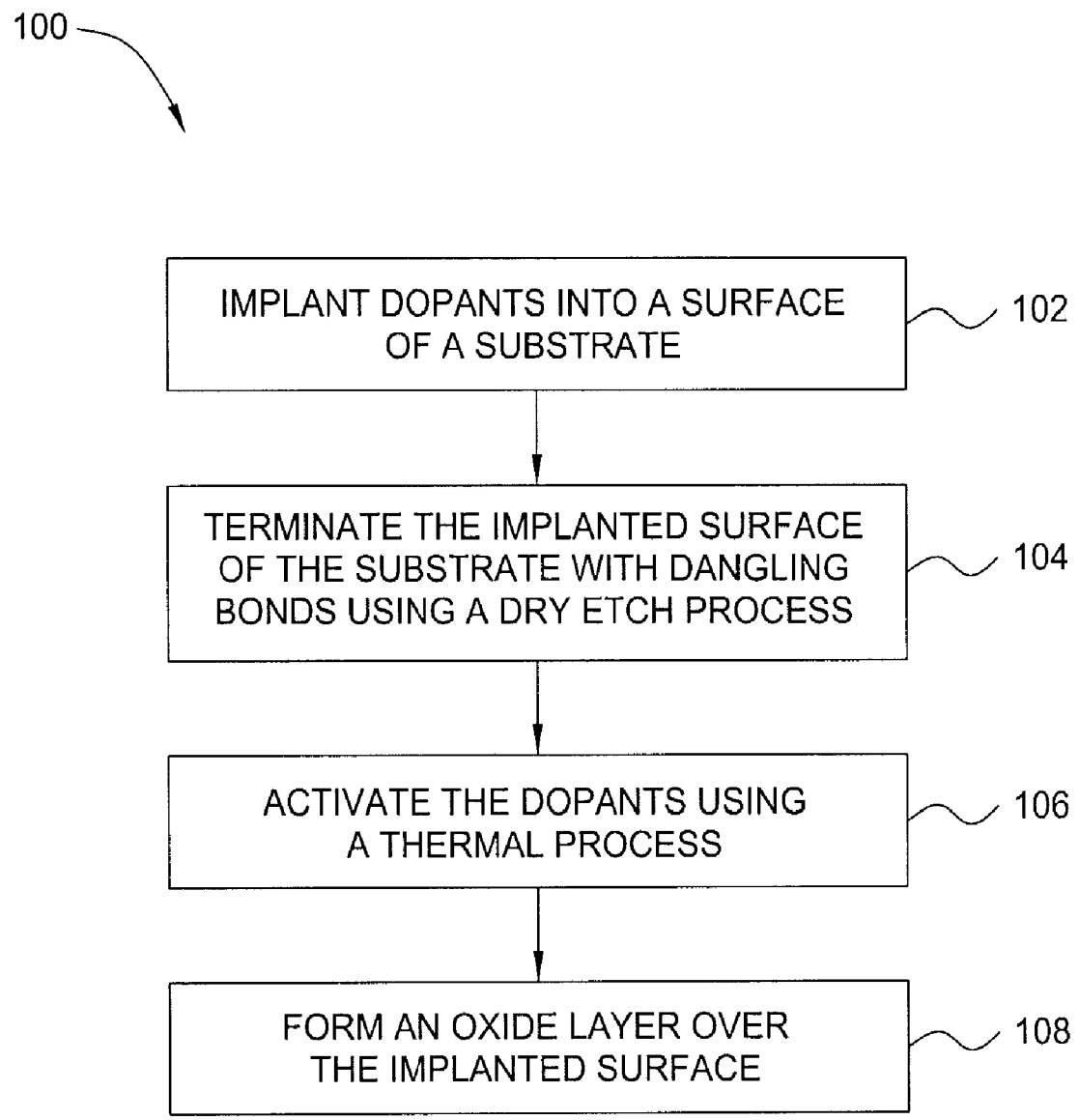
FIG. 1 is a flow diagram summarizing a process according to one embodiment of the invention.

FIG. 1 is a flow diagram summarizing a process 100 according to one embodiment of the invention. The process 100 facilitates forming a device on a substrate. At 102, dopants are implanted into a surface of the substrate. The substrate is disposed in a chamber configured to generate dopant ions which are directed toward the surface of the substrate and implant therein. Implantation processes and apparatus that may be useful in this regard are described in more detail below. At 104, the implanted surface of the substrate is terminated with dangling bonds using an etch process, which may be a dry etch process. The etch process removes any oxides coating the surface, and the dangling bonds facilitate activation of the dopants and repair of the crystal structure following implantation. Etch processes and apparatus that may be useful in this regard are also described in more detail below. At 106, the activation process is accomplished using a thermal process. Thermal processes and apparatus that may be useful in this regard are described in more detail below. At 108, an oxide layer is formed over the implanted surface. In some embodiments, the oxide layer is a gate dielectric. Processes and apparatus for forming a gate dielectric layer are also described in more detail below.

Figure 2:
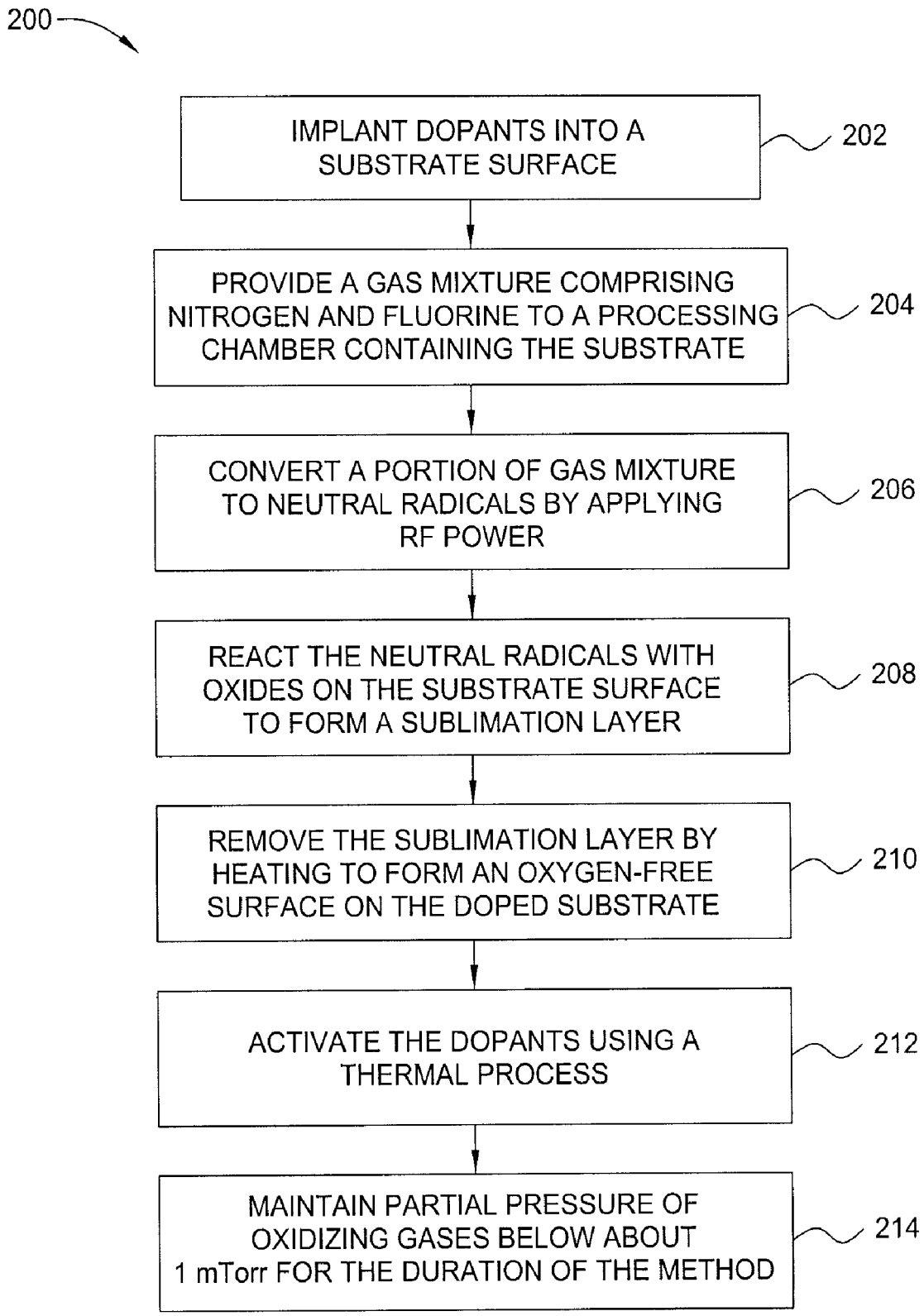
FIG. 2 is a flow diagram summarizing a method according to one embodiment of the invention.

FIG. 2 is a flow diagram summarizing a method 200 according to another embodiment of the invention. Dopants are implanted into a substrate surface at 202. The dopants may be any dopants desirous of implanting, such as p-type or n-type dopants. Boron, phosphorus, and arsenic are commonly implanted dopants. At 204, the substrate is disposed in a processing chamber, which may be the same as, or different from, the chamber in which the implantation is performed, and a gas mixture comprising nitrogen and fluorine is provided to the chamber. At 206, RF power is coupled to the gas mixture to convert a portion thereof into neutral radical species. At 208, the neutral radicals are allowed to contact the surface of the substrate, and react with any oxides on the surface to form a sublimation layer. At 210, the sublimation layer is removed by heating the substrate surface. An article of the processing chamber may be heated to provide a radiant heat source for heating the substrate surface, in some embodiments. The heating treatment of 210 sublimes the sublimation layer, forming an oxygen-free surface on the doped substrate. In some embodiments, the oxygen-free surface also comprises a plurality of dangling bonds. At 212, the substrate is subjected to a thermal process to activate the dopants and repair the crystal structure of the substrate surface. In some embodiments, the oxygen-free surface facilitates the activation and repair process by attracting interstitial atoms to the substrate surface. Interstitial atoms are thus energized to move to crystal lattice points. In some embodiments, the partial pressure of oxidizing gases is maintained below about 1 mTorr for the duration of the method to avoid formation of unwanted oxides during the method, as embodied at 214.

In one embodiment, ions may be implanted using a plasma process. A substrate is disposed in a processing chamber capable of generating a plasma. The substrate generally comprises semiconductor materials such as silicon dioxide, silicon carbide, crystalline silicon, strained silicon, silicon germanium, doped or undoped polysilicon, doped or undoped silicon wafers, doped silicon, germanium, gallium arsenide, gallium nitride, glass, and sapphire. The substrate may have various dimensions, such as 200 mm or 300 mm diameter wafers, as well as, rectangular or square panes.

One or more dopant precursors is provided to the processing chamber. The dopant precursors may be provided separately, or as a mixture, and may be accompanied by one or more carrier gases. The dopant precursors will generally comprise elements to be implanted in the substrate surface, including but not limited to any of the following elements: boron, phosphorus, arsenic, silicon, germanium, gallium, carbon, nitrogen, oxygen, fluorine, chlorine, aluminum, indium, and hydrogen. Some compounds frequently used as dopant precursors include hydrides, fluorides, and chlorides of boron, phosphorus, arsenic, silicon, germanium, and carbon, organosilicon and organogermanium compounds, nitrogen gas, ammonia, and hydrazine, and functional equivalents. Dopant hydrides will have the general formula $Z_aH_b$, where Z is a dopant atom such as B, P, As, Si, Ge, Ga, N, or C, and b is generally an integer multiple of a. Similarly, dopant halides will have the general formula $Z_aX_b$, where Z is a dopant atom such as B, C, P, Si, Ge, Ga, or N, and X is a halogen atom such as Cl or Fl, and b is generally an integer multiple of a. Organosilicon and organogermanium compounds will have the general formula $Si_aR_b$ or $Ge_aR_b$, where each R is hydrogen or an organic functional group. Some exemplary organic functional groups include alkyl, alkenyl, phenyl, and cyclic groups, which may be substituted or functionalized, including hetero atoms such as oxygen and nitrogen, in some cases. Some exemplary dopant precursor gases include, but are not limited to, the following: $H_2$, $O_2$, $BH_3$, $B_2H_6$, $PH_3$, $AsH_3$, $SiH_4$, $CH_4$, $GeH_4$, $Ge_2H_6$, $NH_3$, $PF_3$, $NF_3$, $BF_3$, $SiF_4$, $GeF_2$, $GeF_4$, and GaN. Carrier gases may include any of the following: helium, argon, neon, krypton, or nitrogen gas.

Dopant precursor gases may be provided to the processing chamber at a flow rate between about 10 sccm and about 5,000 sccm each, depending on the size of the substrate being implanted, and may be provided individually or in a gas mixture. Carrier gases may be provided at flow rates between about 1,000 sccm and about 20,000 sccm, individually or in a gas mixture. A single gas mixture may be provided to the processing chamber at a flow rate between about 1,000 sccm and about 20,000 sccm, the gas mixture comprising one or more dopant precursors and one or more carrier gases. A dopant precursor gas mixture comprising one or more dopant precursor gases may be provided to the processing chamber at a flow rate between about 10 sccm and about 5,000 sccm, while a carrier gas mixture comprising one or more carrier gases is provided at a flow rate between about 1,000 sccm and about 20,000 sccm.

The precursor gas mixture is generally ionized by applying an electric field to dissociate the molecules. The ionizing electric field may be applied inside the processing chamber in an ionizing zone immediately adjacent to the processing chamber, or in an ionizing zone remote from the processing chamber. The ionizing electric field may be coupled to the ionizing zone capacitatively, such as by use of one or more parallel plate electrodes, or inductively, such as by use of one or more inductive cores. Gas is made to flow through the ionizing zone having the ionizing electric field coupled therein, such that at least a portion of the gas molecules is dissociated into ions and electrons. The ionizing electric field may be produced by direct current or by alternating current operating at radio frequency (RF), and may be powered from about 100 W to about 2,000 W, depending on the embodiment. In some embodiments, the ionizing electric field may be produced by multiple power sources, such as two alternating sources operating at different frequencies. For example, two RF sources may be coupled into the process gas, one operating at high frequency and one at low frequency, to ensure dissociation of electrons in widely divergent energy states among different molecules.

The ions generated by the ionizing electric field will generally be directed toward the substrate. In some embodiments, the ions may be accelerated toward the substrate by application of an electrical bias to the substrate support, the gas distributor, or both. A voltage bias of between about 50V and about 200V may be applied by direct current or alternating current. A voltage bias generated from alternating current may be produced by application of RF power to one or more electrodes mediated by a high-pass or low-pass filter. The bias may be maintained at power levels between about 100 W and about 2,000 W, depending on the embodiment. The ions impact the surface of the substrate and penetrate the surface to a depth of between about 10 Å and about 2,000 Å, depending on the size and energy of the ions. In some embodiments, the crystal structure of the surface is disrupted, or amorphized, by bombardment with dopant ions. In other embodiments, dopant ions may be large molecules that fragment upon interaction with the substrate surface.

Figure 3A:
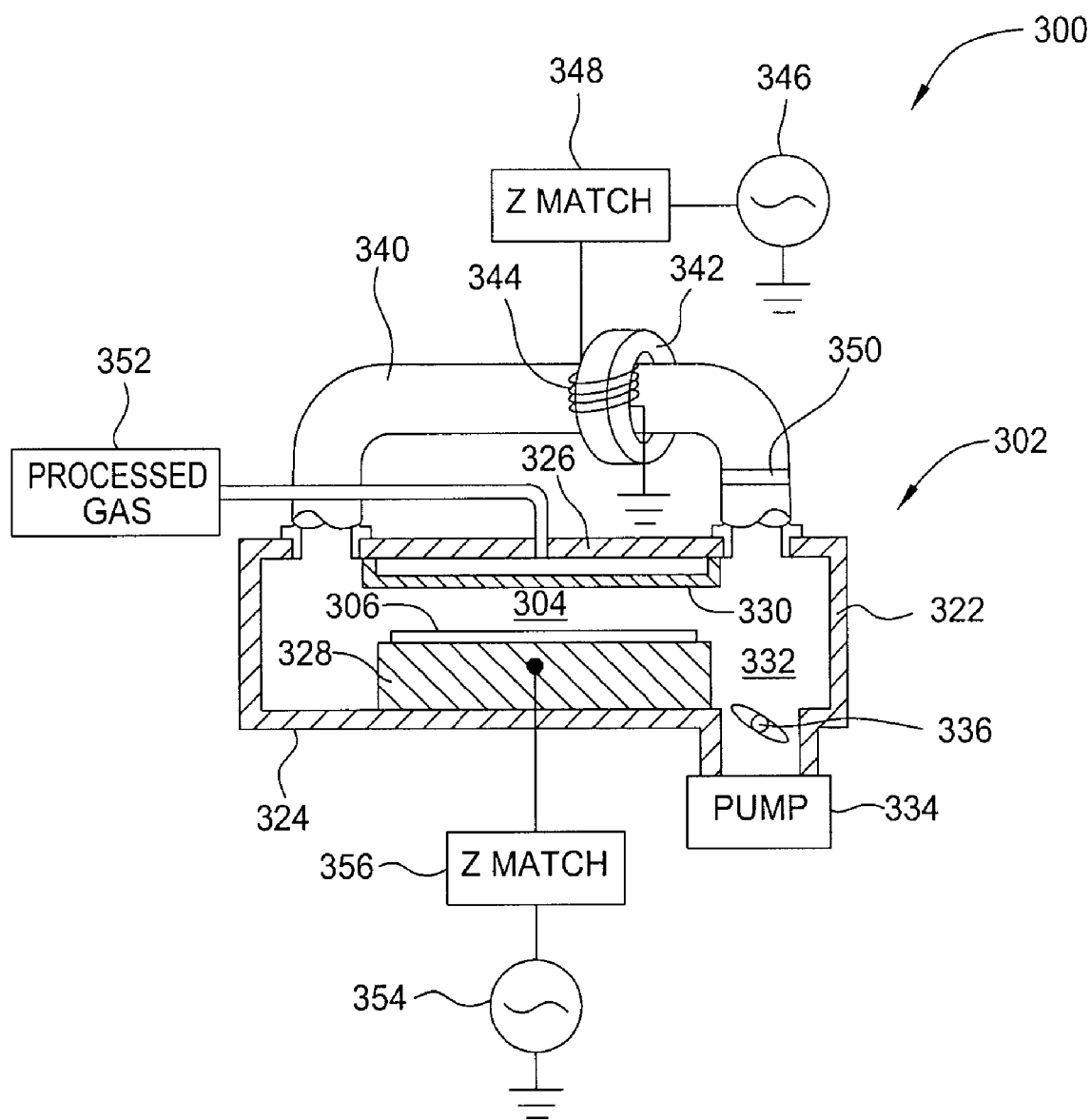
FIG. 3A is a schematic cross-sectional view of an apparatus according to one embodiment of the invention.

FIG. 3A depicts a processing chamber 300 that may be utilized to practice an ion implantation process according to one embodiment of the invention. One suitable reactor chamber which the process may be practiced is a P3i® reactor chamber, available from Applied Materials, Inc., of Santa Clara, Calif. It is contemplated that the methods described herein may be practiced in other suitably adapted plasma reactors, including those from other manufacturers.

The processing chamber 300, which may serve as a plasma reactor in some embodiments, includes a chamber body 302 having a bottom 324, a top 326, and side walls 322 enclosing a process region 304. A substrate support assembly 328 is supported from the bottom 324 of the chamber body 302 and is adapted to receive a substrate 306 for processing. A gas distribution plate 330 is coupled to the top 326 of the chamber body 302 facing the substrate support assembly 328. A pumping port 332 is defined in the chamber body 302 and coupled to a vacuum pump 334. The vacuum pump 334 is coupled through a throttle valve 336 to the pumping port 332. A gas source 352 is coupled to the gas distribution plate 330 to supply gaseous precursor compounds for processes performed on the substrate 306.

Figure 3B:
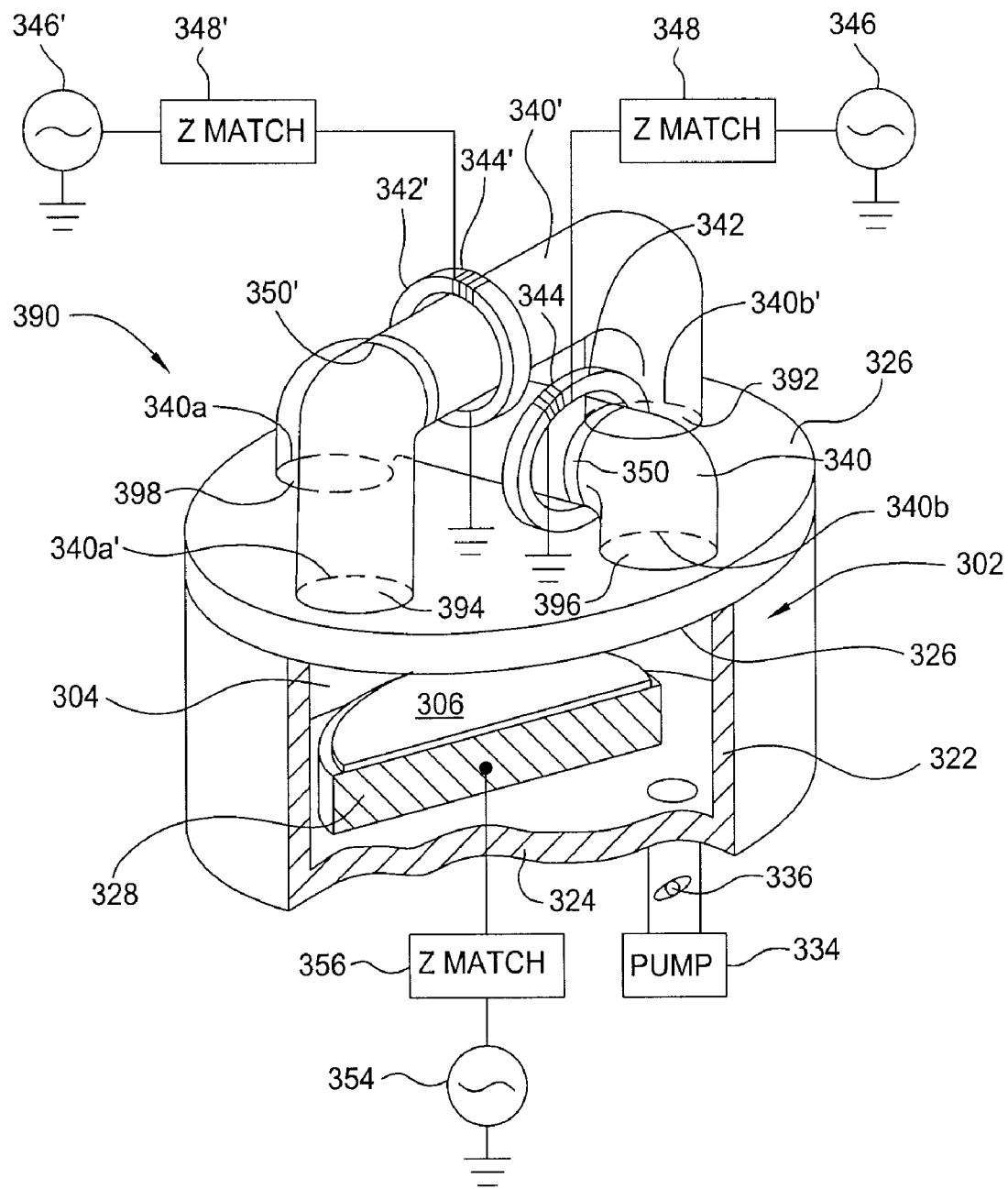
FIG. 3B is a perspective view of the apparatus of FIG. 3A.

The chamber 300 depicted in FIG. 3A further includes a plasma source 390 best shown in the perspective view of FIG. 3B. The plasma source 390 includes a pair of separate external reentrant conduits 340 and 340' mounted on the outside of the top 326 of the chamber body 302 disposed transverse to one another (or orthogonal to one another as the exemplary embodiment depicted in FIG. 3B). The first external conduit 340 has a first end 340a coupled through an opening 398 formed in the top 326 into a first side of the process region 304 in the chamber body 302. A second end 340b has an opening 396 coupled into a second side of the process region 304. The second external reentrant conduit 340b has a first end 340a' having an opening 394 coupled into a third side of the process region 304 and a second end 340b' having an opening 392 into a fourth side of the process region 304. In one embodiment, the first and second external reentrant conduits 340 and 340' are configured to be orthogonal to one another, thereby providing the two ends 340a and 340a', 340b and 340b', of each external reentrant conduit 340 and 340' disposed at about 90 degree intervals around the periphery of the top 326 of the chamber body 302. The orthogonal configuration of the external reentrant conduits 340 and 340' allows a plasma source distributed uniformly across the process region 304. It is contemplated that the first and second external reentrant conduits 340, 340' may have other configurations utilized to control plasma distribution in the process region 304.

Magnetically permeable power applicators 342 and 342' surround a portion of a corresponding one of the external reentrant conduits 340 and 340'. The power applicators 342 and 342', which are torroidal cores in some embodiments, generally comprise conductive coils 344 and 344', which are coupled to respective RF plasma source power generators 346 and 346' through respective impedance match circuits or elements 348 and 348'. Each external reentrant conduits 340 and 340' is a hollow conductive tube interrupted by an insulating annular ring 350 and 350' respectively that interrupts an otherwise continuous electrical path between the two ends 340a and 340b (and 340a' and 304b') of the respective external reentrant conduits 340 and 340'. Ion energy at the substrate surface is controlled by an RF plasma bias power generator 354 coupled to the substrate support assembly 328 through an impedance match circuit or element 356.

Referring back to FIG. 3A, process gases including gaseous compounds supplied from the process gas source 352 are introduced through the overhead gas distribution plate 330 into the process region 304. RF plasma source power generator 346 is coupled from the power applicators 342, with conductive coils 344, to gases supplied in the conduit 340, which creates a circulating plasma current in a first closed torroidal path including the external reentrant conduit 340 and the process region 304. Also, RF plasma source power generator 346' may be coupled from the other power applicators 342', with conductive coils 344', to gases in the second conduit 340', which creates a circulating plasma current in a second closed torroidal path transverse (e.g., orthogonal) to the first torroidal path. The second torroidal path includes the second external reentrant conduit 340' and the process region 304. The plasma currents in each of the paths oscillate (e.g., reverse direction) at the frequencies of the respective RF plasma source power generators 346 and 346', which may be the same or slightly offset from one another.

The power of each plasma source power generator 346 and 346' is maintained so that their combined effect efficiently dissociates the process gases supplied from the process gas source 352 and produces a desired ion flux at the surface of the substrate 306. The power of the RF plasma bias power generator 354 is controlled at a selected level at which the ion energy dissociated from the process gases may be accelerated toward the substrate surface and implanted at a desired depth below the top surface of the substrate 306 in a desired ion concentration. For example, with relatively low RF power, such as less than about 50 eV, relatively low plasma ion energy may be obtained. Dissociated ions with low ion energy may be implanted at a shallow depth between about 1 Å and about 100 Å from the substrate surface. Alternatively, dissociated ions with high ion energy provided and generated from high RF power, such as higher than about 50 eV, may be implanted into the substrate having a depth substantially over 100 Å depth from the substrate surface.

The combination of the controlled RF plasma source power and RF plasma bias power dissociates ion in the gas mixture having sufficient momentum and desired ion distribution in the processing chamber 300. The ions are biased and driven toward the substrate surface, thereby implanting ions into the substrate in a desired ion concentration, distribution and depth from the substrate surface. Furthermore, the controlled ion energy and different types of ion species from the supplied process gases allow ions to be implanted in the substrate 306 to form desired device structures, such as gate structure and source drain region on the substrate 306.

In some embodiments, dopants may be implanted in the surface of a substrate using an ion implant process. A substrate is provided to a processing chamber configured to perform an ion implant process. Molecules containing dopant atoms are provided to an ionizing zone within or adjacent to the processing chamber. The molecules are ionized by application of an electric field, which may be substantially constant or varying. The ions are mass-selected by passing through a magnetic field designed to filter all but the desired ions, and the ions are directed toward the substrate. Ions are generally given kinetic energy in the range of about 1 keV to about 50 keV, with lower energies preferred as implant depths diminish with device scaling. Many ion implant processes operate at energies less than 5 keV, such as about 2 keV. Ions are generally implanted at an average log dose level (base 10 log of ion concentration, $cm^{-3}$) of between about 14 and 16, such as about 15. Most implant processes achieve a maximum log dose level of between about 17 and about 20, such as about 19, at a depth of between about 10 nm and about 100 nm, such as about 20 nm. The depth and profile of implanted concentration will depend on implant energy, with higher energies implanting deeper, and lower energies resulting in shallower implantation. In most processes, implantation at energies below about 2 keV will result in a log dose level peak of about 18 to about 20, such as about 19, at a depth of about 20 nm, decaying at a rate of about 1 nm/dec with depth.

Substrates implanted with dopants are generally annealed to activate the dopants by positioning them at lattice points within the crystal lattice, and to repair the crystal lattice disrupted by the implant. The inventors have discovered that the annealing process is enhanced by preparing the doped substrate surface in a way that leaves dangling bonds at the surface. The dangling bonds facilitate movement of subsurface dislocated atoms into crystal lattice positions by attracting interstitial atoms toward the surface. The interstitials reach the surface and annihilate the dangling bonds, allowing them to delocalize within the crystal lattice. The reduction in energy state available from such annihilation attracts interstitials to the surface and promotes recrystallization of the disrupted lattice at lower levels of energy input.

In most embodiments, a native oxide layer is removed from the substrate surface following implant and preceding anneal. Use of an etch process can remove the oxide layer and leave the surface with dangling bonds to promote annealing. An exemplary etch process for removing native oxides on a surface of the substrate using an ammonia ($NH_3$) and nitrogen trifluoride ($NF_3$) gas mixture performed within a processing chamber will now be described. The etch process begins by placing a substrate into a processing chamber such as a dry etching chamber. During processing, the substrate may be cooled below 65° C., such as between 15° C. and 50° C. In another example, the substrate is maintained at a temperature of between 22° C. and 40° C. Typically, the substrate support is maintained below about 22° C. to reach the desired substrate temperatures.

The substrate is disposed in an etching chamber, and precursor ammonia gas and nitrogen trifluoride gas are introduced into the etching chamber to form a cleaning gas mixture. In some embodiments, the etching chamber is a dry etching chamber. The amount of each gas introduced into the chamber is variable and may be adjusted to accommodate, for example, the thickness of the oxide layer to be removed, the geometry of the substrate being cleaned, the volume capacity of the precursor delivery system, and the volume capacity of the chamber body. In one aspect, the gases are added to provide a gas mixture having at least a 1:1 molar ratio of ammonia to nitrogen trifluoride. In another aspect, the molar ratio of the gas mixture is at least about 3 to about 1 (ammonia to nitrogen trifluoride). Preferably, the gases are introduced in the dry etching chamber at a molar ratio of from about 1:1 (ammonia to nitrogen trifluoride) to about 30:1, more preferably, from about 5:1 (ammonia to nitrogen trifluoride) to about 30:1. More preferably, the molar ratio of the gas mixture is from about 5 to 1 (ammonia to nitrogen trifluoride) to about 10 to about 1. The molar ratio of the gas mixture may also fall between about 10:1 (ammonia to nitrogen trifluoride) and about 20:1. Alternatively, a pre-mixed gas mixture of the preferred molar ratio may be used during the plasma etch process.

A purge gas or carrier gas may also be added to the gas mixture. Any suitable purge/carrier gas may be used, such as argon, helium, hydrogen, nitrogen, forming gas, or mixtures thereof. Typically, the overall gas mixture by volume of ammonia and nitrogen trifluoride is within a range from about 0.05% to about 20%. The remainder of the process gas may be the carrier gas. In one embodiment, the purge or carrier gas is first introduced into the chamber body before the reactive gases to stabilize the pressure within the chamber body.

The operating pressure within the chamber body can be variable. The pressure may be maintained within a range from about 500 mTorr to about 30 Torr, preferably, from about 1 Torr to about 10 Torr, and more preferably, from about 3 Torr to about 6 Torr. A RF power within a range from about 5 watts to about 600 watts may be applied to activate the gas mixture within the chamber body. Preferably, the RF power is less than about 100 watts, such as about 60 watts or less, preferably, about 50 watts or less, and more preferably, about 40 watts or less. In one embodiment, a lower RF power is utilized during the process to ignite the gas mixture and form the cleaning plasma. The RF power may be within a range from about 5 watts to about 50 watts, preferably, from about 15 watts to about 30 watts. In one example, the plasma is generated with a RF power of about 30 watts or less. In another example, the plasma is generated with a RF power of about 15 watts or less. More preferable is that the frequency at which the power is applied is very low, such as less than about 100 kHz, and more preferably, within a range from about 50 kHz to about 90 kHz.

The RF energy activates the ammonia and nitrogen trifluoride gases into reactive species that combine to form a highly reactive ammonium fluoride ($NH_4F$) compound and/or ammonium hydrogen fluoride ($NH_4F.HF$) which reacts with the substrate surface. In one embodiment, activation of the precursor gases generates electrically neutral radicals that react with the substrate surface. In one embodiment, the carrier gas is first introduced into the etch chamber, a plasma of the carrier gas is generated, and then the reactive gases, ammonia and nitrogen trifluoride, are added to the plasma. The carrier gas plasma activates the precursor gases into the reactive species.

In some embodiments, the RF energy is applied at a location outside the processing chamber, and the activated species then flow into the chamber. This allows any charged species developed by application of the RF energy to recombine and be neutralized. Neutral species are generally preferred over charged species for most cleaning processes featuring active species. The RF energy fragments molecules of the precursor gases into ions and electrons. As the ions and electrons flow toward the processing chamber, they recombine into electrically neutral species, at least some of which are neutral radicals. The length of the flow path from the activation location to the processing chamber is chosen so that charged species have enough time to substantially recombine, but radical species do not have enough time to recombine into molecules. In some embodiments, this process may be aided by use of a carrier gas such as helium. The carrier gas may ionize in the RF field to an extent and provide more electrons to speed the neutralization process. The extra molecules may also slow the process of radicals recombining into molecules. Finally, in some embodiments, any fugitive charged species may be filtered out by application of a weak electrical bias in the processing chamber to steer charged species away from the substrate.

Not wishing to be bound by theory, it is believed that the etchant gas, $NH_4F$ and/or $NH_4F.HF$, reacts with the native oxide surface to form ammonium hexafluorosilicate (($NH_4)_2SiF_6$), ammonia, and water. The ammonia and water are vapors at processing conditions and removed from the chamber by a vacuum pump attached to the chamber. A thin film of ammonium hexafluorosilicate is left behind on the substrate surface.

The thin film of ammonium hexafluorosilicate on the substrate surface may be removed during a vacuum sublimation process. The processing chamber, or a fixture thereof, radiates heat to dissociate or sublime the thin film of ammonium hexafluorosilicate into volatile $SiF_4$, $NH_3$, and HF products. These volatile products are then removed from the chamber by the vacuum pump attached to the system. In one example, a temperature of about 75° C. or higher is used to effectively sublime and remove the thin film from the substrate. Preferably, a temperature of about 100° C. or higher is used, such a temperature within a range from about 115° C. to about 200° C. Once the film has been removed from the substrate, the chamber is purged and evacuated prior to removing the cleaned substrate.

Figure 4:
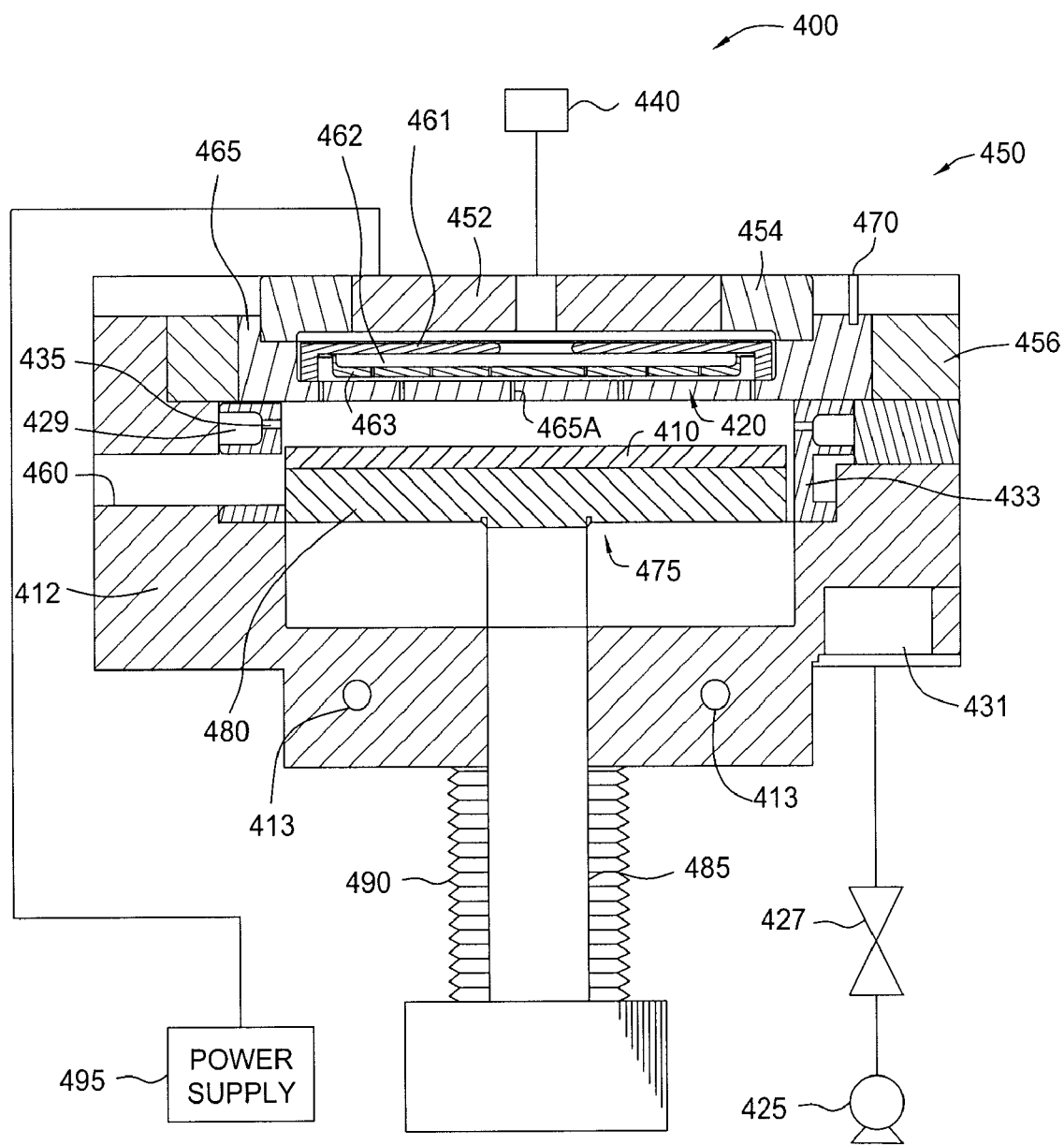
FIG. 4 is a schematic cross-sectional view of an apparatus according to another embodiment of the invention.

A process as described above may be performed using a vacuum preclean chamber, such as a SICONI® Preclean chamber and process, both available from Applied Materials, Inc., located in Santa Clara, Calif. FIG. 4 schematically illustrates a sectional view of processing chamber 400 in accordance with one embodiment of the present invention. In this embodiment, processing chamber 400 includes lid assembly 450 disposed at an upper end of chamber body 412, and support assembly 475 at least partially disposed within chamber body 412. The processing chamber also includes remote plasma generator 440 having a remote electrode with a U-shaped cross section. Processing chamber 400 and the associated hardware are preferably formed from one or more process-compatible materials, for example, aluminum, anodized aluminum, nickel plated aluminum, nickel plated aluminum 6061-T6, stainless steel, as well as combinations and alloys thereof.

Support assembly 475 is partially disposed within chamber body 412. Support assembly 475, comprising support member 480, is raised and lowered by shaft 485 which is enclosed by bellows 490. Chamber body 412 includes slit valve opening 460 formed in a sidewall thereof to provide access to the interior of processing chamber 400. Slit valve opening 460 is selectively opened and closed to allow access to the interior of chamber body 412 by a substrate handling robot (not shown). In one embodiment, a substrate may be transported in and out of processing chamber 400 through slit valve opening 460 to an adjacent transfer chamber and/or load-lock chamber (not shown), or another chamber within a cluster tool. Illustrative cluster tools include but are not limited to the PRODUCER®, CENTURA®, ENDURA®, and ENDURA SL™ platforms, available from Applied Materials, Inc., located in Santa Clara, Calif.

Chamber body 412 also includes channel 413 formed therein for flowing a heat transfer fluid therethrough. The heat transfer fluid may be a heating fluid or a coolant and is used to control the temperature of chamber body 412 during processing and substrate transfer. The temperature of chamber body 412 is important to prevent unwanted condensation of the gas or byproducts on the chamber walls. Exemplary heat transfer fluids include water, ethylene glycol, or a mixture thereof. An exemplary heat transfer fluid may also include nitrogen gas.

Chamber body 412 further includes a liner 433 that surrounds support assembly 475, and is removable for servicing and cleaning. Liner 433 is preferably made of a metal such as aluminum, or a ceramic material. However, other materials which are compatible may be used during the process. Liner 433 may be bead blasted to increase the adhesion of any material deposited thereon, thereby preventing flaking of material which results in contamination of processing chamber 400. Liner 433 typically includes one or more apertures 435 and a pumping channel 429 formed therein that is in fluid communication with a vacuum system. Apertures 435 provide a flow path for gases into pumping channel 429, and the pumping channel provides a flow path through liner 433 so the gases can exit processing chamber 400.

The vacuum system may comprise vacuum pump 425 and throttle valve 427 to regulate flow of gases within processing chamber 400. Vacuum pump 425 is coupled to a vacuum port 431 disposed on chamber body 412, and is in fluid communication with pumping channel 429 formed within liner 433. Vacuum pump 425 and chamber body 412 are selectively isolated by throttle valve 427 to regulate flow of the gases within processing chamber 400. The terms "gas" and "gases" may be used interchangeably, unless otherwise noted, and refer to one or more precursors, reactants, catalysts, carrier, purge, cleaning, combinations thereof, as well as any other fluid introduced into chamber body 412.

Lid assembly 450 contains a number of components stacked together. For example, lid assembly 450 contains a lid rim 456, gas delivery assembly 420, and top plate 454. Lid rim 456 is designed to hold the weight of the components making up lid assembly 450 and is coupled to an upper surface of chamber body 412 to provide access to the internal chamber components. Gas delivery assembly 420 is coupled to an upper surface of lid rim 456 and is arranged to make minimum thermal contact therewith. The components of lid assembly 450 are preferably constructed of a material having a high thermal conductivity and low thermal resistance, such as an aluminum alloy with a highly finished surface, for example. Preferably, the thermal resistance of the components is less than about $5 \times 10^{-4}$ $m^2$ K/W.

Gas delivery assembly 420 may comprise a gas distribution plate 465 or showerhead. A gas supply panel (not shown) is typically used to provide the one or more gases to processing chamber 400. The particular gas or gases that are used depend upon the process to be performed within processing chamber 400. For example, the typical gases include one or more precursors, reductants, catalysts, carriers, purge, cleaning, or any mixture or combination thereof. Typically, the one or more gases are introduced to processing chamber 400 into lid assembly 450 and then into chamber body 412 through holes 465A in gas distribution plate 465. An electronically operated valve and/or flow control mechanism (not shown) may be used to control the flow of gas from the gas supply into processing chamber 400. An RF power may be applied to electrode 240 to ignite a plasma of the gas mixture within volumes 461, 462, and 463 contained in gas delivery assembly 420.

In one aspect, the gas is delivered from the gas supply panel to processing chamber 400 where the gas line tees into two separate gas lines which feed gases to chamber body 412 as described above. Depending on the process, any number of gases may be delivered in this manner and may be mixed either in processing chamber 400 or before they are delivered to processing chamber 400.

Still referring to FIG. 4, lid assembly 450 may further include electrode 452 to generate a plasma of reactive species within lid assembly 450. In this embodiment, electrode 452 is supported on top plate 454 and is electrically isolated therefrom. An isolator filler ring (not shown) is disposed about a lower portion of electrode 452 separating electrode 452 from top plate 454. An annular isolator (not shown) is disposed about an upper portion of the isolator filler ring and rests on an upper surface of top plate 454, as shown in FIG. 4. An annular insulator (not shown) is then disposed about an upper portion of electrode 452 so that electrode 452 is electrically isolated from the other components of lid assembly 450. Each of these rings, the isolator filler and annular isolators may be made from aluminum oxide or any other electrically insulating, process compatible material.

Electrode 452 is coupled to a power source 495 while gas delivery assembly 420 is connected to ground. Accordingly, a plasma of the one or more process gases is struck in the volume formed between electrode 452 and gas delivery assembly 420. The plasma may also be contained within the volumes formed by blocker plates. In the absence of a blocker plate assembly, the plasma is struck and contained between electrode 452 and gas delivery assembly 420. In either embodiment, the plasma is well confined or contained within lid assembly 450.

Any power source capable of activating the gases into reactive species and maintaining the plasma of reactive species may be used. For example, radio frequency (RF), direct current (DC), alternating current (AC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into processing chamber 400. Exemplary remote plasma generators are available from vendors such as MKS Instruments, Inc., and Advanced Energy Industries, Inc. Preferably, an RF power supply is coupled to electrode 452.

Gas delivery assembly 420 may be heated depending on the process gases and operations to be performed within processing chamber 400. In one embodiment, heating element 470, such as a resistive heater for example, is coupled to gas delivery assembly 420. In one embodiment, heating element 470 is a tubular member and is pressed into an upper surface of gas delivery assembly 420. The upper surface of gas delivery assembly 420 includes a groove or recessed channel having a width slightly smaller than the outer diameter of heating element 470, such that heating element 470 is held within the groove using an interference fit. Heating element 470 regulates the temperature of gas delivery assembly 420.

Having been treated to form dangling bonds, the substrate surface is then subjected to a thermal treatment process, such as an anneal process, to activate and distribute the dopants, and the repair the crystal lattice. Thermal processes such as furnace annealing, rapid thermal annealing (RTA) and dynamic surface annealing (DSA) may be used to thermally treat the substrate. The thermal treatment process generally comprises heating the implanted portion of the substrate to excite movement of interstitial atoms into crystal lattice positions. It is generally preferred to heat and cool the doped portion rapidly to minimize unwanted diffusion of dopants deeper into the substrate. Most thermal treatment processes will thus heat the doped portion of the substrate at a rate of between about 200° C./sec and about 500° C./sec to an anneal temperature, maintain the anneal temperature for an anneal interval, and then switch off the heating energy to accomplish rapid cooling.

Heating of a substrate may be accomplished through any convenient combination of heating sources. Such sources may include conductive, convective, or radiant sources. In some embodiments, the substrate may be heated using a heated substrate support. In other embodiments, the substrate may be heated using electromagnetic energy, which may be supplied by one or more lasers, flash lamps, heat lamps, arc lamps, halogen lamps, or other light sources. In some embodiments, more than one such source may be combined.

For example, in some embodiments, a heated substrate support may be used to heat the substrate to an intermediate temperature, and an electromagnetic source, such as a laser or flash lamp, used to rapidly heat the doped substrate surface to the anneal temperature. The substrate may be heated all at once, the entire substrate surface being heated at the same time, or in sections. For example, an electromagnetic energy source may be focused on one portion of the substrate surface to anneal that portion, and then focused on another portion, successively annealing portions of the substrate surface to accomplish the entire process.

In a typical process, the substrate may be heated to a temperature between about 300° C. and about 600° C. using a heated substrate support. One or more lasers are then used to heat successive portions of the substrate surface to about 700° C. or more to accomplish the anneal process. In many embodiments, an anneal temperature of 700° C. will be sufficient to anneal the substrate surface due to the presence of dangling bonds at the surface. The laser of the current embodiment may be configured to deliver between about 100 W/cm$^2$ and about 1,000 W/cm$^2$, such as between about 300 W/cm$^2$ and about 700 W/cm$^2$, for example about 500 W/cm$^2$ to the substrate surface.

In embodiments featuring use of electromagnetic energy for annealing, the electromagnetic energy motivates interstitial atoms to move to crystal lattice locations. While not wishing to be bound by theory, it is believed that the electromagnetic energy acts on the interstitial atoms in two ways, by exciting thermal motion resembling vibration, and by applying radiation pressure as a pushing force. Thus, in addition to vibrating the interstitial atoms into motion through the solid, the radiation pressure pushes on the atoms, thus reducing the amount of vibration required to induce free motion.

In embodiments featuring the use of furnace heating for annealing, the presence of dangling bonds allows annealing at reduced temperatures to minimize opportunities for dopant diffusion. A substrate may be annealed at a temperature of between about 650° C. and about 850° C., such as less than about 850° C., or about 700° C., for one hour to accomplish the anneal. In some embodiments, the substrate may be annealed at a temperature below about 750° C. for no more than one hour. In other embodiments, the substrate may be annealed at a temperature of about 700° C. or below for no more than one hour.

Some embodiments of the invention feature formation of a gate dielectric layer following activation of the doped substrate surface. The gate dielectric layer may be a silicon oxide layer formed by a thermal oxidation process. The silicon oxide layer may be deposited a rapid thermal process (RTP), conventional chemical vapor deposition (CVD), rapid thermal-CVD (RT-CVD), plasma enhanced-CVD (PE-CVD), physical vapor deposition (PVD), atomic layer deposition (ALD), atomic layer epitaxy (ALE) or combinations thereof.

Preparation of an oxygen-free surface prior to formation of the gate oxide layer enhances the quality of the gate oxide layer. Not wishing to be bound by theory, it is believed that conventional cleaning steps leave traces of low-quality native or processed oxide on the substrate surface that do not interface cleanly with the underlying substrate. Imperfections in the interface between the residual oxide impair the electrical properties of the eventual device by increasing resistivity at the interface. Complete removal of all traces of oxygen at the substrate surface prior to forming the gate oxide layer removes all such imperfections and sources of resistivity.

In one embodiment, the silicon oxide layer is a thermal oxide layer deposited with an RTP process at a temperature from about 650 degrees Celsius to about 980 degrees Celsius, such as from about 750 degrees Celsius to about 950 degrees Celsius. The silicon oxide layer is deposited having a thin thickness less than about 30 Å, such as less than about 20 Å, for example, about 15 Å or less. A process gas mixture including oxygen gas ($O_2$) is supplied into the chamber between about 0.5 slm to about 10 slm, such as about 2 slm. The process pressure may be regulated between about 0.5 Torr and about 50 Torr, such as 2 Torr. The deposition process may be performed between about 5 seconds to about 30 seconds. A RADIANCE® process chamber, available from Applied Materials, Inc., of Santa Clara, Calif., may be used to practice some embodiments of the invention.

A plasma treatment may be performed to treat the silicon oxide layer while forming a plasma-treated layer. The plasma treatment may comprise a decoupled inert gas plasma process performed by flowing an inert gas into a decoupled plasma nitridation (DPN) chamber or a remote inert gas plasma process by flowing an inert gas into a process chamber equipped by a remote plasma system.

In one embodiment, the plasma treatment is performed in a DPN chamber. The silicon oxide layer is bombarded with ionic nitrogen formed by flowing nitrogen ($N_2$) into the DPN chamber. Gases that may be used in the plasma process include nitrogen containing gas, such as $N_2$ or $NH_3$, argon (Ar), helium (He), neon, xenon or combinations thereof. The nitrogen gas flowed into the DPN chamber adds nitrogen to the silicon oxide layer, forming a treated layer on the upper surface of the silicon oxide layer. In one embodiment, the nitrogen concentration treated on the silicon oxide layer may be between about $2 \times 10^{15}$ atomic weight percent per square centimeters (at/cm$^2$) and about $8 \times 10^{15}$ atomic weight percent per square centimeters (at/cm$^2$).

In one embodiment, the plasma process proceeds for a time period from about 10 seconds to about 300 seconds, for example, from about 30 seconds to about 240 seconds, and in one embodiment, from about 60 seconds to about 180 seconds. Also, the plasma process is conducted at a plasma power setting from about 500 watts to about 3,000 watts, for example, from about 700 watts to about 2,500 watts, for example, from about 900 watts to about 1,800 watts. Generally, the plasma process is conducted with a duty cycle of about 10 percent to about 90 percent, and at a pulse frequency at about 10 kHz. The DPN chamber may have a pressure from about 10 mTorr to about 80 mTorr. The inert gas may have a flow rate from about 10 standard cubic centimeters per minute (sccm) to about 5 standard liters per minute (slm), or from about 50 sccm to about 750 sccm, or from about 100 sccm to about 500 sccm.

In some embodiments, a silicon nitride layer may be deposited on the silicon oxide layer. In one embodiment, the silicon nitride layer is deposited to a thickness of less than about 20 Å, such as less than about 15 Å, for example, about 10 Å or less. The gate dielectric layer, comprising the silicon nitride layer and the silicon oxide layer, provides a low equivalent oxide thickness (EOT), thereby reducing gate leakage and increasing the stability and density of the dielectric materials.

In some embodiments, the silicon nitride layer 308 is deposited by a thermal CVD process, such as a low pressure chemical vapor deposition (LPCVD). Examples of process chamber used to deposit silicon nitride layers include the SiNgen® Plus system available from Applied Materials, Inc. Alternatively, the silicon nitride layer may be deposited by PECVD, PVD, or ALD.

In one embodiment, the silicon nitride layer is deposited with a Thermal-CVD process at a temperature from about 400 degrees Celsius to about 800 degrees Celsius, such as from about 500 degrees Celsius to about 700 degrees Celsius, for example, about 600 degrees Celsius. A process gas mixture including a nitrogen containing gas and a silicon containing gas, such as $SiH_4$, is supplied into the chamber. Suitable nitrogen containing gases include, but are not limited to, $NH_3$, $N_2$, $N_2O$, and the like. Suitable silicon containing gases include, but are not limited to, $SiH_4$, $Si_2H_6$, dichlorosilane (DCS), tetrachlorosilane (TCS), or hexachlorodisilane (HCD) and the like. In one embodiment, the gas mixture may be supplied by a predetermined ratio of the nitrogen containing gas and silicon containing gas ranging between about 1:1 to about 1,000:1 into the process chamber. In another embodiment, the gas mixture may be supplied by controlling the gas flow of nitrogen containing gas between about 10 sccm and about 1,000 sccm, for example, between about 10 sccm and about 100 sccm, such as about 25 sccm, and silicon containing gas between about 1 sccm and about 100 sccm, for example, between about 1 sccm and about 50 sccm, such as 10 sccm. The process pressure may be regulated between about 0.5 Torr and about 50 Torr, for example, between about 1 Torr and about 25 Torr, such as 5 Torr. The deposition process may be performed between about 30 seconds to about 1,800 seconds.

In some embodiments, a second plasma treatment step, which may be substantially similar to the first plasma treatment step, may be performed on the silicon nitride layer. The second plasma step is performed to densify the silicon nitride layer while forming the plasma-treated layer. The second plasma treatment step may include a decoupled inert gas plasma process performed by flowing an inert gas into a decoupled plasma nitridation (DPN) chamber or a remote inert gas plasma process by flowing an inert gas into a process chamber equipped by a remote plasma system.

In some embodiments, the gate dielectric layer comprising the deposited silicon oxide layer and the silicon nitride layer, is exposed to a thermal annealing process. An example of a suitable RTP chamber in which the thermal treatment may be performed is the RADIANCE RTP chamber, available from Applied Materials, Inc., of Santa Clara, Calif., among others.

In one embodiment, the substrate may be thermally heated to a temperature from about 600 degrees Celsius to about 1,200 degrees Celsius. In another embodiment, the temperature may be from about 700 degrees Celsius to about 1,150 degrees Celsius, such as between about 800 degrees Celsius and about 1,000 degrees Celsius. The thermal annealing process may have different durations. In one embodiment, the duration of the thermal annealing process may be from about 1 second to about 180 seconds, for example, about 2 seconds to about 60 seconds, such as about 5 seconds to about 30 seconds. At least one annealing gas is supplied into the chamber for thermal annealing process. Examples of annealing gases include oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof or combinations thereof. The annealing gas may contain nitrogen and at least one oxygen-containing gas, such as oxygen. The chamber may have a pressure from about 0.1 Torr to about 100 Torr, for example, about 0.1 to about 50 Torr, such as 0.5 Torr. In one example of a thermal annealing process, a substrate is heated to a temperature of about 1,000 degrees Celsius for about 15 seconds within an oxygen atmosphere. In another example, a substrate is heated to a temperature of about 1,100 degrees Celsius for about 10 seconds to about 25 seconds within an atmosphere containing equivalent volumetric amounts of nitrogen and oxygen during the annealing process.

The thermal annealing process converts the silicon oxide layer and the silicon nitride layer to a post anneal layer. The thermal annealing process repairs any damage caused by prior plasma bombardment and reduces the fixed charge of the post anneal layer. The post anneal layer may have a nitrogen concentration with different ranges. In one embodiment, the nitrogen concentration of the post anneal layer is between about $2\times10^{15}$ atoms/cm$^2$ and about $7\times10^{15}$ atoms/cm$^2$. The post anneal layer has a smooth surface, which in some embodiments has a surface roughness less than about 0.25 nm as inspected by a conventional Atomic Force Microscope. In one embodiment, the post anneal layer, comprising the thermally treated gate dielectric layer, may have a combined film thickness between about 10 Å to about 30 Å. In another embodiment, the combined thickness may be from about 12 Å to about 28 Å. In yet another embodiment, the thickness may be from about 15 Å to about 25 Å, such as 20 Å.

Some embodiments of the invention provide one or more wet clean treatments prior to an etch cleaning process as described above or after formation of the gate oxide layer. The wet clean treatments may be a buffered oxide etch (BOE) process, a SC1 process, a SC2 process, or a HF-last process. A substrate may be treated by wet clean processes, such as an acidic cleaning process (e.g., a solution containing hydrochloric acid and hydrogen peroxide held at elevated temperature, such as SC2 clean), a basic cleaning process (e.g., a solution containing ammonium hydroxide and hydrogen peroxide held at elevated temperature, such as SC1 clean), or a series of wet cleans containing both acidic and basic cleaning processes. In a preferred wet clean embodiment, a substrate is exposed to a SC1 solution (e.g., TMAH and $H_2O_2$) to remove organic residues and other contaminants, and subsequently exposed to a BOE solution (e.g., 0.5 M of TEA-HF solution) to remove native oxides.

A wet clean process may include dispensing a wet clean solution across or sprayed on the surface of a substrate. The wet clean process may be an in situ process performed in the same processing cell as a subsequent electroless deposition process. Alternatively, a substrate may be wet cleaned in a separate processing cell from the subsequent electroless deposition processing cell. A wet-clean pretreatment process may occur for about 10 minutes or less, such as within a range from about 5 seconds to about 5 minutes, preferably, from about 5 seconds to about 3 minutes, more preferably, from about 10 seconds to about 2 minutes, and more preferably, from about 15 seconds to about 1 minute. During the pretreatment process, the substrate is maintained at a temperature within a range from about 15° C. to about 50° C., preferably, about room temperature (e.g., 20° C.). The wet-clean process may be performed in a TEMPEST® wet-clean system, available from Applied Materials, Inc., located in Santa Clara, Calif.

In one embodiment, native oxide may be removed from a substrate surface by a HF-last solution to form an exposed surface as a substantially oxide-free, silicon hydride surface. In one example, the wet-clean process utilizes an HF-last solution containing water, HF and optional additives including chelators, surfactants, reductants, other acids or combinations thereof. In one example, the hydrogen fluoride concentration of a wet-clean solution may be within a range from about 10 ppm to about 5 wt %, preferably, from about 50 ppm to about 2 wt %, and more preferably, from about 100 to about 1 wt %, for example, about 0.5 wt %. In another embodiment, native oxide is removed during a liquid reduction process to form an exposed surface as a substantially oxide-free, silicon-containing surface.

In some embodiments, a substrate with a native oxide layer, or other types of substrates, may be exposed to a SC1 clean solution, a SC2 clean solution, or both, to remove contaminants, such as organic and inorganic residues and particulates while forming an exposed surface. In one example, the SC1 clean solution contains hydrogen peroxide and at least one basic compound, such as ammonium hydroxide, tetramethylammonium hydroxide, ethanolamine, diethanolamine, triethanolamine, derivatives thereof, salts thereof, or combinations thereof. In another example, the SC2 clean solution contains hydrogen peroxide and hydrogen chloride. The substrate may be heated to a temperature within a range from about 50° C. to about 100° C., preferably, from about 70° C. to about 90° C.

In another embodiment of a wet clean process, buffered oxide etch (BOE) solutions and processes may be used to selectively remove native oxides and other contaminants from substrates. The BOE solutions generally contain an alkylamine compound or an alkanolamine compound and an etchant, such as hydrogen fluoride. The alkanolamine compounds may include ethanolamine (EA), diethanolamine (DEA), triethanolamine (TEA), or derivatives thereof. In one example, a native oxide layer may be removed to form an exposed surface by exposing a substrate having a native oxide layer to a BOE solution containing about 0.5 M of TEA-HF solution for about 25 seconds at about 20° C. In another example, a substrate may be exposed to a BOE solution containing about 0.5 M of EA-HF solution for about 20 seconds at about 20° C. In another example, a substrate may be exposed to a BOE solution containing about 0.5 M of DEA-HF solution for about 30 seconds at about 20° C.

Figure 5:
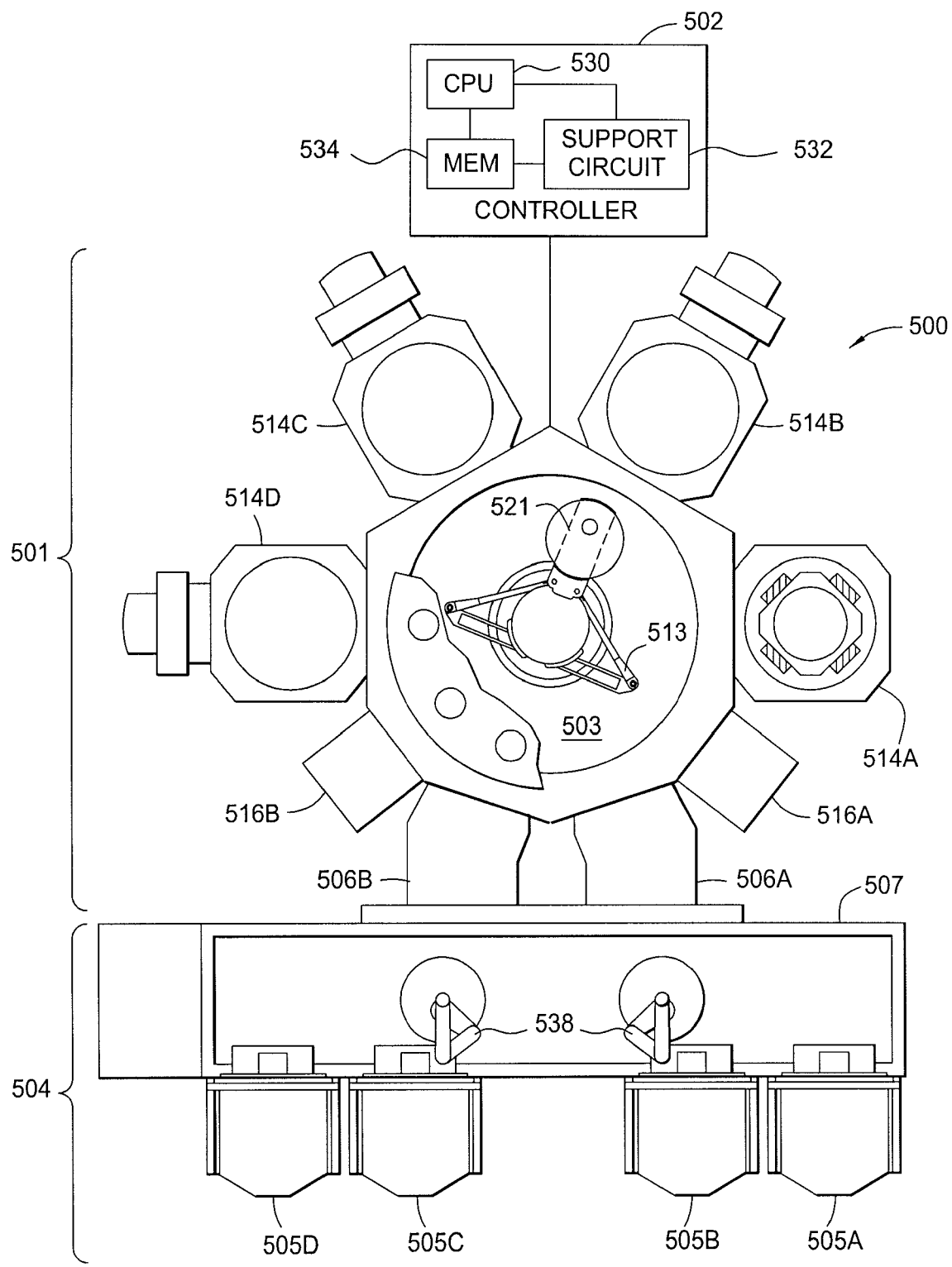
FIG. 5 is a plan view of an integrated apparatus according to another embodiment of the invention.

Embodiments of the invention provide an apparatus for processing a substrate in many of the ways described herein. FIG. 5 is a schematic view of an integrated tool 500 which may be utilized for processing semiconductor substrates according to embodiments of the present invention. Examples of the integrated tool 500 include the CENTURA and ENDURA integrated tool, all available from Applied Materials, Inc., of Santa Clara, Calif. It is contemplated that the methods described herein may be practiced in other tools having the requisite process chambers coupled thereto.

The tool 500 includes a vacuum-tight processing platform 501, a factory interface 504, and a system controller 502. The platform 501 comprises a plurality of processing chambers 514A-D and load-lock chambers 506A-B, which are coupled to a vacuum substrate transfer chamber 503. The factory interface 504 is coupled to the transfer chamber 503 by the load lock chambers 506A-B.

In one embodiment, the factory interface 504 comprises at least one docking station 507, at least one factory interface robot 538 to facilitate transfer of substrates. The docking station 507 is configured to accept one or more front opening unified pod (FOUP). Four FOUPS 505A-D are shown in the embodiment of FIG. 5. The factory interface robot 538 is configured to transfer the substrate from the factory interface 504 to the processing platform 501 for processing through the load-lock chambers 506A-B.

Each of the load-lock chambers 506A-B have a first port coupled to the factory interface 504 and a second port coupled to the transfer chamber 503. The load-lock chambers 506A-B are coupled to a pressure control system (not shown) which pumps down and vents the chambers 506A-B to facilitate passing the substrate between the vacuum environment of the transfer chamber 503 and the substantially ambient (e.g., atmospheric) environment of the factory interface 504.

The transfer chamber 503 has a vacuum robot 513 disposed therein. The vacuum robot 513 is capable of transferring substrates 521 between the load-lock chamber 506A-B and the processing chambers 514A-D.

In one embodiment, the processing chambers coupled to the transfer chamber 503 may be a CVD chamber 514D, a DPN chamber 514C, an RTP chamber 514B, or an ALD chamber 514A. Alternatively, different processing chambers, including at least one ALD, CVD, MOCVD, PVD, DPN, RTP chamber, may be interchangeably incorporated into the integrated tool 500 in accordance with process requirements. Suitable ALD, CVD, PVD, DPN, RTP, and MOCVD processing chambers are available from Applied Materials, Inc., among other manufacturers. In a preferred embodiment, the processing chambers 514A-D comprise an implant chamber using a plasma or ion beam apparatus, a plasma treatment chamber, an anneal chamber such as an RTA or DSA chamber, and an oxidation chamber such as an RTP chamber.

In one embodiment, an optional service chamber (shown in 516A-B) may be coupled to the transfer chamber 503. The service chambers 516A-B may be configured to perform other substrate processes, such as degassing, orientation, cool down and the like.

The system controller 502 is coupled to the integrated processing tool 500. The system controller 502 controls the operation of the tool 500 using a direct control of the process chambers 514A-D of the tool 500 or alternatively, by controlling the computers (or controllers) associated with the process chambers 514A-D and tool 500. In operation, the system controller 502 enables data collection and feedback from the respective chambers and system to optimize performance of the tool 500.

The system controller 502 generally includes a central processing unit (CPU) 530, a memory 534, and support circuit 532. The CPU 530 may be one of any form of a general purpose computer processor that can be used in an industrial setting. The support circuits 532 are conventionally coupled to the CPU 530 and may comprise cache, clock circuits, input/output subsystems, power supplies, and the like. Software routines for executing methods and processes according to embodiments of the invention, when executed by the CPU 530, transform the CPU into a specific purpose computer (controller) 502. The software routines may also be stored and/or executed by a second controller (not shown) that is located remotely from the tool 500.

While the foregoing is directed to embodiments of the invention, other and further embodiments of the invention may be devised without departing from the basic scope thereof.

What is claimed is:

1. A method of processing a doped semiconductor substrate, comprising:
    disposing the doped semiconductor substrate in a processing chamber;
    providing a cleaning gas comprising a mixture of ammonia, nitrogen trifluoride, and a carrier gas to the processing chamber;
    converting a portion of the cleaning gas to neutral radicals by applying RF power;
    forming a sublimation layer on the doped semiconductor substrate by exposing the substrate to the cleaning gas while cooling the substrate;
    forming an oxygen-free surface on the doped semiconductor substrate by heating the sublimation layer; and
    activating the dopants in the doped semiconductor substrate by an annealing process, wherein a partial pressure of oxidizing gases is maintained below about 1 mTorr during the aforementioned disposing, providing, converting, forming, forming, and activating.

2. The method of claim 1, wherein the substrate temperature is maintained below about 100° C. while forming the sublimation layer.

3. The method of claim 1, wherein heating the sublimation layer comprises positioning the sublimation layer proximate to a hot showerhead.

4. A process for forming a device on a substrate, comprising:
    implanting dopants into a surface of the substrate;
    terminating the implanted surface with dangling bonds by exposing the substrate to a reducing gas at a temperature less than about 100° C.;
    activating the dopants by heating the implanted surface of the substrate; and
    forming an oxide layer over the implanted surface.

5. The process of claim 4, wherein the reducing gas comprises nitrogen and fluorine.

6. The process of claim 5, wherein terminating the implanted surface with dangling bonds comprises forming a sublimation layer over the implanted surface, and removing the sublimation layer by positioning the sublimation layer proximate to a hot showerhead and heating the sublimation layer to a temperature at or above 100° C.

7. The process of claim 4, wherein the reducing gas comprises electrically neutral radicals.

8. The process of claim 7, wherein the reducing gas comprises nitrogen and fluorine radicals, and the reducing gas forms a sublimation layer on the substrate that is subsequently removed by heating to a temperature at or above 100° C.

9. The process of claim 8, wherein the implanted surface of the substrate is hydrogen-terminated at the time the dopants are activated by heating.

10. The process of claim 4, wherein implanting dopants into the substrate surface, terminating the substrate surface with dangling bonds, and activating the dopants are all performed in a substantially oxygen-free atmosphere that is maintained during and between the implanting, terminating, and activating processes.

11. The process of claim 10, wherein forming an oxide layer over the implanted surface comprises exposing the implanted surface to an oxidizing gas in the presence of RF power.

12. A method of forming a device on a substrate, comprising:
    implanting dopants into a surface of the substrate;
    disposing the substrate in a processing chamber configured to produce a charge-free reducing gas comprising neutral radicals;
    applying RF energy at a remote location to form neutral radicals comprising nitrogen and fluorine;
    flowing the neutral radicals into the processing chamber and exposing the doped surface of the substrate to the neutral radicals;
    reacting the neutral radicals with the substrate surface at a temperature less than about 100° C. to form a thin film;
    removing the thin film by heating a fixture of the processing chamber, positioning the fixture near the substrate surface, and heating the substrate surface;
    generating dangling bonds on the substrate surface;
    activating the dopants using a furnace annealing process; and
    forming an oxide layer over the implanted surface.

13. The method of claim 12, wherein the furnace annealing process comprises heating the substrate surface to a temperature less than about 850° C.

* * * * *